(12) United States Patent
Hong

(10) Patent No.: US 12,363,795 B2
(45) Date of Patent: Jul. 15, 2025

(54) METHOD FOR DETERMINING NETWORK SWITCHING RESOURCE AND METHOD FOR CONFIGURING NETWORK SWITCHING RESOURCE

(71) Applicant: BEIJING XIAOMI MOBILE SOFTWARE CO., LTD., Beijing (CN)

(72) Inventor: Wei Hong, Beijing (CN)

(73) Assignee: BEIJING XIAOMI MOBILE SOFTWARE CO., LTD., Beijing (CN)

(*) Notice: Subject to any disclaimer, the term of this patent is extended or adjusted under 35 U.S.C. 154(b) by 394 days.

(21) Appl. No.: 17/614,513

(22) PCT Filed: May 29, 2019

(86) PCT No.: PCT/CN2019/088988
§ 371 (c)(1),
(2) Date: Nov. 26, 2021

(87) PCT Pub. No.: WO2020/237523
PCT Pub. Date: Dec. 3, 2020

(65) Prior Publication Data
US 2022/0210705 A1    Jun. 30, 2022

(51) Int. Cl.
*H04W 76/38* (2018.01)
*H04W 36/00* (2009.01)
(Continued)

(52) U.S. Cl.
CPC ....... *H04W 76/38* (2018.02); *H04W 36/0072* (2013.01); *H04W 36/14* (2013.01);
(Continued)

(58) Field of Classification Search
CPC ......... H04W 68/005–02; H04W 88/06; H04W 36/165; H04W 52/0209–0216; H04W 76/28–38
See application file for complete search history.

(56) References Cited

U.S. PATENT DOCUMENTS 8,320,271 B2 * 11/2012 Fodor ............... H04W 52/0216
370/252
8,964,672 B2 * 2/2015 Suzuki ............... H04W 68/025
370/329
(Continued)

FOREIGN PATENT DOCUMENTS

CN    101754150 A    6/2010
CN    101951653 A    1/2011
(Continued)

OTHER PUBLICATIONS

First Office Action of Indian Application No. 202127057576 dated Aug. 24, 2022 with partial English translation, (6p).
(Continued)

*Primary Examiner* — Brendan Y Higa
(74) *Attorney, Agent, or Firm* — Arch & Lake LLP

(57) ABSTRACT

Provided is a method for determining a network switching resource, including: acquiring second system time information for performing activities in a second operator network and time reference information for performing activities in the second operator network; transmitting the second system time information and time reference information to a first operator network; receiving configuration information generated by the first operator network at least according to the second system time information and/or the time reference information; according to the configuration information, determining a time domain resource on which a terminal is disconnected from the first operator network and performs activities in the second operator network.

20 Claims, 9 Drawing Sheets

(51) Int. Cl.
  *H04W 36/14* (2009.01)
  *H04W 60/04* (2009.01)
  *H04W 68/00* (2009.01)
  *H04W 76/28* (2018.01)
  *H04W 88/06* (2009.01)

(52) U.S. Cl.
  CPC .......... *H04W 60/04* (2013.01); *H04W 76/28* (2018.02); *H04W 88/06* (2013.01); *H04W 68/005* (2013.01)

(56) References Cited

U.S. PATENT DOCUMENTS

| | | | |
|---|---|---|---|
| 9,907,001 | B2 | 2/2018 | Jin et al. |
| 9,935,730 | B1* | 4/2018 | Terzis .................. H04L 1/0031 |
| 11,330,556 | B2* | 5/2022 | Kumar .................. H04W 8/24 |
| 2008/0101268 | A1* | 5/2008 | Sammour ......... H04W 52/0206 370/332 |
| 2009/0318177 | A1* | 12/2009 | Wang ................. H04W 68/025 455/515 |
| 2010/0215026 | A1 | 8/2010 | Cheng et al. |
| 2012/0014332 | A1 | 1/2012 | Smith et al. |
| 2013/0070656 | A1* | 3/2013 | Chin ..................... H04W 68/02 370/311 |
| 2013/0150036 | A1* | 6/2013 | Pattaswamy ......... H04W 76/15 455/435.1 |
| 2013/0281094 | A1 | 10/2013 | Ryu et al. |
| 2013/0303203 | A1* | 11/2013 | Wang .................... H04W 68/00 455/458 |
| 2014/0073366 | A1* | 3/2014 | Xing ..................... H04W 76/28 455/458 |
| 2014/0342700 | A1 | 11/2014 | Srinivasan et al. |
| 2014/0349646 | A1* | 11/2014 | Su ......................... H04W 76/16 455/436 |
| 2015/0005018 | A1* | 1/2015 | Klatt .................... H04W 76/28 455/458 |
| 2015/0105080 | A1 | 4/2015 | Jin |
| 2015/0237555 | A1 | 8/2015 | Jin et al. |
| 2016/0014691 | A1* | 1/2016 | Rastogi ............. H04W 52/0209 370/311 |
| 2016/0044592 | A1 | 2/2016 | Guilford et al. |
| 2016/0295439 | A1* | 10/2016 | Yang ..................... H04W 24/10 |
| 2016/0381656 | A1 | 12/2016 | Bevan et al. |
| 2017/0135095 | A1 | 5/2017 | Chandwan et al. |
| 2017/0150386 | A1* | 5/2017 | Hoover ............. H04W 36/0088 |
| 2017/0230932 | A1* | 8/2017 | Challa .................. H04W 68/02 |
| 2018/0220329 | A1* | 8/2018 | Arumugam ......... H04L 65/1073 |
| 2019/0069224 | A1 | 2/2019 | Lee et al. |
| 2020/0037380 | A1 | 1/2020 | Qiu et al. |
| 2022/0201566 | A1* | 6/2022 | Shrivastava ...... H04W 52/0216 |

FOREIGN PATENT DOCUMENTS

| | | |
|---|---|---|
| CN | 102111853 A | 6/2011 |
| CN | 102917448 A | 2/2013 |
| CN | 103518401 A | 1/2014 |
| CN | 103634791 A | 3/2014 |
| CN | 103702377 A | 4/2014 |
| CN | 103988553 A | 8/2014 |
| CN | 104094656 A | 10/2014 |
| CN | 105813061 A | 7/2016 |
| CN | 105916149 A | 8/2016 |
| CN | 106068015 A | 11/2016 |
| CN | 108024334 A | 5/2018 |
| CN | 110383891 B | 10/2021 |
| EP | 3439350 A1 | 2/2019 |
| EP | 3962174 A1 | 3/2022 |
| WO | 2013170140 A2 | 11/2013 |
| WO | 2017107637 A1 | 6/2017 |
| WO | 2018176675 A1 | 10/2018 |

OTHER PUBLICATIONS

Notice of Allowance issued in Chinese Application No. 201980000954.3 dated Jul. 28, 2021 with English translation, (6p).
Extended European Search Report issued in Application No. 19930451.0, dated Dec. 20, 2022,(13p).
Ericsson,"Dual-SIM Dual-Standby UEs and their impact on the RAN", 3GPP TSG-RAN WG2 #75bis, Tdoc R2-115375, Zhuhai, China, Oct. 10-14, 2011,(3p).
SA WG2,"Revised SID: Study on system enablers for multi-SIM devices",TSG SA Meeting #SP-83,SP-190248, Mar. 20-22, 2019, Shenzhen, China, (Revision of SP-190179), (4p).
International Search Report of International Application No. PCT/CN2019/088988 dated Mar. 2, 2020 with English translation, (4p).
First Office Action issued to Chinese Application No. 201980000954.3 dated Dec. 30, 2020 with English translation (12p).
Notice of Allowance issued in Chinese Application No. 20198000094.3 dated Jul. 28, 2021 with English translation (6p).
Jianming Zhou, "Vertical Handoff of Wireless Heterogeneous Network", Communications Technology, vol. 44, No. 5, 2011, dated Dec. 31, 2011, (5p).
Daquan Yang, "Wireless Network Based on ECMA-392 Technology", Telecommunication Engineering, vol. 54, No. 1 dated Feb. 22, 2014, (6p).
Jiang Luo, "The Impact of DRX on TD-LTE Network End-To-End Delay", Telecommunications Information, dated Feb. 28, 2015, (5p).
CNOA issued in Application No. 202111188889.7, dated Jun. 29, 2023 with English translation, (20p).
CN NOA issued in Application No. 202111188889.7, dated Aug. 9, 2023 with English translation, (8p).

* cited by examiner

METHOD FOR DETERMINING NETWORK SWITCHING RESOURCE AND METHOD FOR CONFIGURING NETWORK SWITCHING RESOURCE

CROSS-REFERENCE

This application is a U.S. national stage of International Application No. PCT/CN2019/088988, filed May 29, 2019, the disclosure of which is hereby incorporated by reference in its entirety.

TECHNICAL FIELD

The present disclosure relates to the field of communication technologies, and in particular, to a method for determining a network switching resource, a method for configuring a network switching resource, a device for determining a network switching resource, a device for configuring a network switching resource, an electronic device and a computer-readable storage medium.

BACKGROUND

For a multi-card mobile phone, taking a dual-card mobile phone as an example, In the case where subscriber identity module (SIM) card 1 is connected to an operator A's network, SIM card 2 needs to perform activities in an operator B's network sometimes, which may lead the mobile phone to interrupt activities in the operator A's network.

Since the operator A's network does not know that this is caused by the activities of SIM card 2 in the mobile phone in the operator B's network, it will generally be determined that there is a problem with the communication connection with the mobile phone. Accordingly, the operator A's network will increase the power, or even trigger a wireless link recovery mechanism when determining that the wireless link is failure.

However, even if the operator A's network increases the power or even triggers the wireless link recovery mechanism, since the mobile phone is performing activities in the operator B's network through SIM card 2, during this period, it will not recovery activities in the operator A's network. As a result, the operator A's network performs an invalid operation, leading to a waste of the resources of the operator A's network.

SUMMARY

In view of the above, the present disclosure provides a method for determining a network switching resource, a method for configuring a network switching resource, a device for determining a network switching resource, a device for configuring a network switching resource, an electronic device and a computer-readable storage medium.

According to a first aspect of embodiments of the present disclosure, a method for determining a network switching resource is provided. The method is applied to a terminal configured to be connected to at least two operator networks, the method includes:

in response to being connected to a second operator network in the two operator networks, acquiring second system time information for performing activities in the second operator network and time reference information for performing activities in the second operator network;

in response to being connected to a first operator network in the two operator networks, transmitting the second system time information and the time reference information to the first operator network;

receiving configuration information generated, according to at least one of the second system time information and the time reference information, by the first operator network;

determining, according to the configuration information, a time domain resource on which the terminal is disconnected from the first operator network and performs activities in the second operator network.

According to a second aspect of embodiments of the present disclosure, a method for configuring a network switching resource is provided. The method is applied to a terminal configured to be connected to at least two operator networks, the method includes:

receiving system time information of a second operator network and time reference information of a terminal performing activities in the second operator network that are transmitted from the terminal;

determining, according to the second system time information and the time reference information, a time domain resource on which the terminal is disconnected from the first operator network and performs activities in the second operator network;

generating configuration information according to the time domain resource; and transmitting the configuration information to the terminal.

According to a third aspect of the embodiments of the present disclosure, a device for determining a network switching resource is provided. The device is applied to a terminal configured to be connected to at least two operator networks, the device includes:

an information acquisition module, configured to: in response to being connected to a second operator network in the two operator networks, acquire second system time information for performing activities in the second operator network and time reference information for performing activities in the second operator network;

an information transmission module, configured to: in response to being connected to a first operator network in the two operator networks, transmit the second system time information and the time reference information to the first operator network;

a configuration reception module, configured to receive configuration information generated, according to at least one of the second system time information and the time reference information, by the first operator network; and a resource determination module, configured to determine, according to the configuration information, a time domain resource on which the terminal is disconnected from the first operator network and performs activities in the second operator network.

According to a fourth aspect of embodiments of the present disclosure, a device for configuring a network switching resource is provided. The device is applied to a first operator network, the device includes:

an information reception module, configured to receive system time information of a second operator network and time reference information of a terminal performing activities in the second operator network that are transmitted from the terminal;

a resource determination module, configured to determine, according to at least one of the second system time information and the time reference information, a time domain resource on which the terminal is disconnected from the first operator network and performs activities in the second operator network;

a configuration generation module, configured to generate configuration information according to the time domain resource; and a configuration transmission module, configured to transmit the configuration information to the terminal.

According to a fifth aspect of the embodiments of the present disclosure, an electronic device is provided. The electronic device includes:

a processor; and a memory for storing instructions executable by the processor;

the processor is configured to implement the method for determining the network switching resource according to any embodiment described above.

According to a sixth aspect of the embodiments of the present disclosure, an electronic device is provided. The electronic device includes:

a processor; and a memory for storing instructions executable by the processor;

the processor is configured to implement the method for configuring the network switching resource according to any embodiment described above.

According to a seventh aspect of the embodiments of the present disclosure, a computer-readable storage medium is provided. A computer program is stored on the computer-readable storage medium, and the program, when executed by a processor, is used to implement the steps in the method for determining a network switching resource according to any embodiment described above.

According to an eighth aspect of the embodiments of the present disclosure, a computer-readable storage medium is provided. A computer program is stored on the computer-readable storage medium, and the program, when executed by a processor, is used to implement the steps in the method for configuring a network switching resource according to any embodiment described above.

BRIEF DESCRIPTION OF THE DRAWINGS

In order to more clearly describe the technical solutions in the embodiments of the present disclosure, the following will briefly introduce the accompanying drawings used in the description of the embodiments. Apparently, the accompanying drawings in the following description are only some embodiments of the present disclosure. For those of ordinary skill in the art, other drawings can be obtained based on these drawings without creative labor.

DETAILED DESCRIPTION

The technical solutions in the embodiments of the present disclosure will be clearly and completely described below in conjunction with the accompanying drawings in the embodiments of the present disclosure. Apparently, the described embodiments are only a part of the embodiments of the present disclosure, not all of the embodiments. Based on the embodiments in the present disclosure, all other embodiments obtained by those of ordinary skill in the art without creative work belong to the protection scope of the present disclosure.

Figure 1:
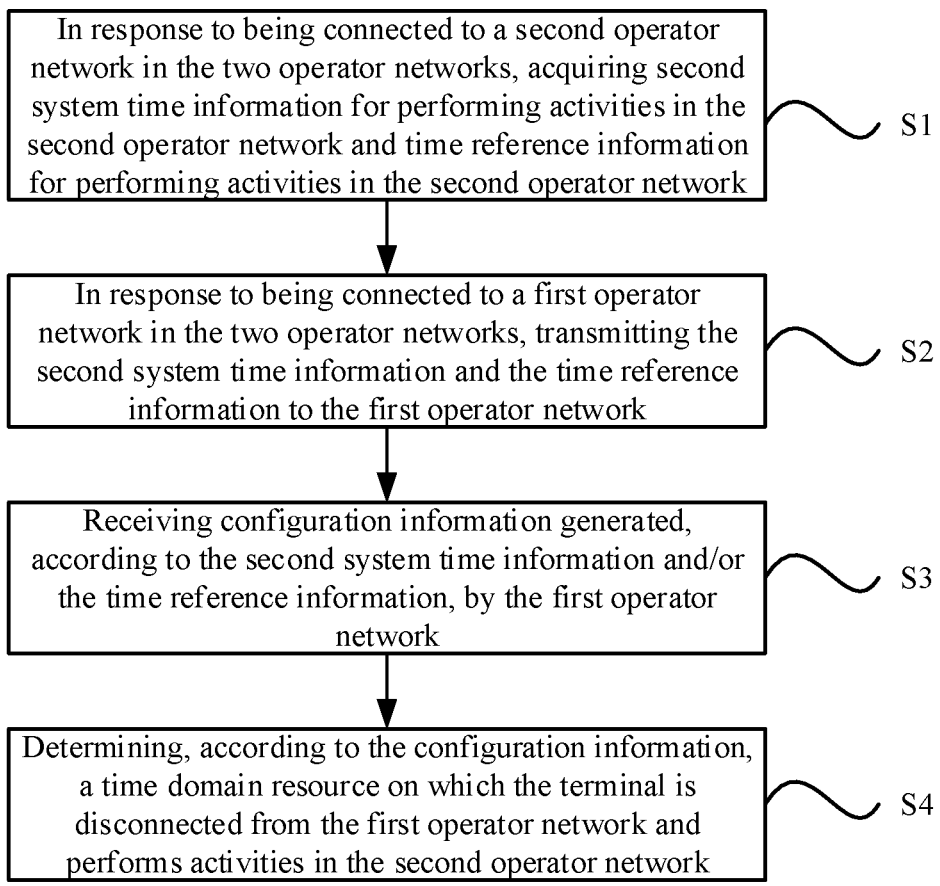
FIG. 1 is a schematic flowchart illustrating a method for determining a network switching resource according to some embodiments of the present disclosure.

FIG. 1 is a schematic flowchart illustrating a method for determining a network switching resource according to some embodiments of the present disclosure. The method for determining a network switching resource shown in the embodiments of the present disclosure may be applicable to a terminal. The terminal may perform communications based on a multi-card single standby (for example, dual-card single-standby) mode, a multi-card multi-standby (for example, dual-card dual-standby) mode, or a multi-card multi-standby multi-pass (for example, dual-card dual-standby dual-pass) mode.

The terminal is configured to connect to at least two operator networks, for example, the terminal may be used as user equipment to communicate with a base station in an operator network. The terminal may be provided with a plurality of SIM cards, specifically USIM (Universal Subscriber Identity Module). SIM card 1 in the plurality of SIM cards may be connected to a first operator network, and SIM card 2 in the plurality of SIM cards may be connected to a second operator network. The first operator network and the second operator network are networks provided by different operators, for example, the first operator network may be a mobile network, and the second operator network may be a network of China Unicom or China Telecom.

As shown in FIG. 1, the method for determining a network switching resource includes steps described below.

In step S1, in response to the terminal being connected to a second operator network in the two operator networks, the following information is acquired: second system time information of performing activities in the second operator network; and time reference information of performing activities in the second operator network.

In an embodiment, when being connected to the second operator network, the terminal may acquire the second system time information of the second operator network and the time reference information of performing activities in the second operator network. For example, SIM card 2 in the terminal may acquire and store the second system time information and the time reference information.

In step S2, in response to being connected to a first operator network in the two operator networks, the second system time information and the time reference information are transmitted to the first operator network.

In an embodiment, when being connected to the first operator network, the terminal may transmit the second system time information of the second operator network and the time reference information of performing activities in the second operator network to the first operator network. For example, SIM card 2 in the terminal may transmit the stored second system time information and the time reference information to SIM card 1, and then the second system time information and the time reference information are transmitted to the first operator network by the SIM card 1.

In step S3, configuration information is received, and the configuration information is generated by the first operator network according to the second system time information and/or the time reference information.

In an embodiment, after receiving the second system time information and the time reference information, the first operator network can determine the time domain resource according to the second system time information and/or the time reference information, and then generate the configuration information according to the time domain resource.

The second system time information is used to represent a relative time for the terminal to perform activities in the second operator network. For example, the second system time information is a system frame number (SFN), the activity is receiving the system message transmitted from the second operator network, and the time reference information is a system message transmission period.

For example, a system frame at which the terminal receives the system message in the second operator network is the 6th frame, and the system message transmission period is 5 milliseconds.

In the case where the first operator network generates the configuration information according to the second system time information and the time reference information, for example, the determined time domain resource is the 6th frame+n×5 milliseconds in the second operator network, and then the configuration information is generated according to the determined time domain resource, and the user equipment receives the system message transmitted from the second operator network according to a time domain resource configured by the configuration information.

Accordingly, on the one hand, the time domain resource is determined according to the relative time of the second operator network, on the other hand, the configured time domain resources are made to meet the requirements of the terminal's activities in the second operator network, ensuring that the terminal can quickly receive the system message transmitted from the second operator network after being disconnected from the first operator network according to the configuration information, without waiting for a long time for the action of the second operator network, and can complete the activities in the second operator network as soon as possible. After performing activities in the second operator network, when it is necessary to reconnect to the first operator network, the connection to the first operator network can be restored as soon as possible, which is beneficial to ensure the good effect of communication between the first operator network and the terminal.

In the case where the first operator network generates the configuration information according to the second system time information, conditions of the terminal's activities in the first operator network may be considered. For example, the communication quality of the terminal with the first operator network, a type of business that the terminal communicates with the first operator network, etc. Take the type of business that the terminal communicates with the first operator network as an example, if the type of business of the communication between the terminal and the first operator network has lower latency requirements at the time t1 after the 6th frame in the second operator network, then the time domain resource can be determined to be the 6th frame+t1 in the second operator network, and then the configuration information is generated according to the determined time domain resource.

Accordingly, on the one hand, the time domain resource is determined according to the relative time of the second operator network, on the other hand, the configured time domain resources are made to meet the requirements of the terminal's activities in the first operator network. At the time domain resource corresponding to the 6th frame+t1 in the second operator network, the type of business of the communication between the terminal and the first operator network has lower latency requirements, thus the user equipment is configured according to the configuration information to receive the system message transmitted from the second operator network on the time domain resource, so that the impact on the business due to disconnection from the first operator network is low.

In the case where the first operator network generates the configuration information according to the time reference information, a relative time of the first operator network, that is, first system time information of the first operator network, can be considered. For example, when the terminal received the system message in the second operator network last time, the system frame number of the first operator network was the 13th frame, then the determined time domain resource was the 13th frame+n×5 milliseconds in the first operator network, and then the configuration information is generated according to the determined time domain resource. The user equipment receives the system message transmitted from the second operator network according to the time domain resource configured by the configuration information.

Accordingly, on the one hand, the time domain resources are determined according to the relative time of the first operator network, on the other hand, the configured time domain resources are made to meet the requirements of the terminal's activities in the second operator network, ensuring that the terminal can quickly receive the system message transmitted from the second operator network after being disconnected from the first operator network according to the configuration information, without waiting for a long time for the action of the second operator network, and can complete the activities in the second operator network as soon as possible. After performing activities in the second operator network, when it is necessary to reconnect to the first operator network, the connection to the first operator network can be restored as soon as possible, which is beneficial to ensure the good effect of communication between the first operator network and the terminal.

It should be noted that, in addition to the second system time information and/or the time reference information, other factors can also be used by the first operator network to determine the time domain resource and generate the configuration information, which may be specifically provided as needed.

In step S4, a time domain resource, on which the terminal is disconnected from the first operator network and performs activities in the second operator network, is determined according to the configuration information.

According to the embodiments of the present disclosure, the terminal transmits the second system time information and the time reference information to the first operator network, so that the first operator network can relatively accurately configure the time domain resource for the terminal. During this process, the first operator network does not need to interact with the second operator network, and the consumption caused by interaction between the operator networks can be reduced.

Moreover, since the time domain resource is configured by the first operator network to the terminal, the configured time domain resource is known by the first operator network, thus when the terminal is disconnected from the first operator network on the time domain resource and performs activities in the second operator network, the first operator network will not mistakenly believe that there is a problem with the communication connection with the terminal, and will not increase the power, or even trigger the wrong operation of the wireless link recovery mechanism, thus effectively avoiding the waste of the network resource of the first operator.

Figure 2:
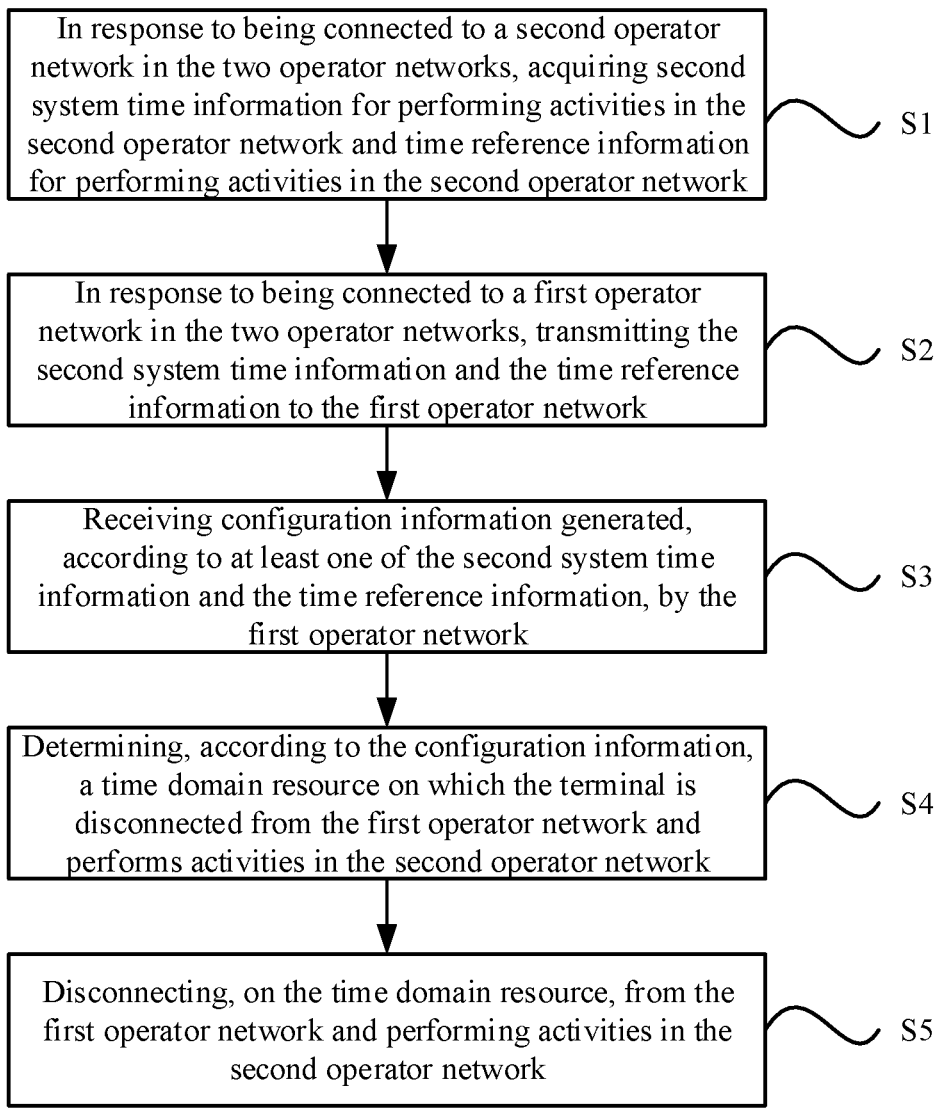
FIG. 2 is a schematic flowchart illustrating another method for determining a network switching resource according to some embodiments of the present disclosure.

FIG. 2 is a schematic flowchart illustrating another method for determining a network switching resource according to some embodiments of the present disclosure. As shown in FIG. 2, the method further includes step S5.

In step S5, on the time domain resource, the terminal is disconnected from the first operator network and performs activities in the second operator network.

In an embodiment, after determining the time domain resource, the first terminal may disconnect from the first operator network on the time domain resource, and perform activities in the second operator network. Alternatively, the terminal may determine whether to disconnect from the first operator network on the time domain resource and perform activities in the second operator network according to actual situations at the time domain resource. If so, the terminal disconnects from the first operator network on the time domain resource, and performs activities in the second operator network.

The actual situation includes but is not limited to: a priority of the communication between the first terminal and the first operator network, whether the SIM card 2 is still in the terminal, and remaining capacity of the terminal or the like.

For example, on the time domain resource, the priority of the communication between the first terminal and the first operator network is the highest, then it is determined that there is no need to disconnect the first terminal from the first operator network on the time domain resource to perform activities in the second operator network, so as to ensure that the highest level of communication can continue, where the priority of the communication between the first terminal and the first operator network can be determined based on the type of business the first terminal communicates with the first operator network, quality of service, quality of service class identifier, etc., for example, if the service quality level identifier is 1, the priority is the highest.

For example, if SIM card 2 is not in the terminal, it can also be determined that there is no need to disconnect the terminal from the first operator network on the time domain resource to perform activities in the second operator network, so as to avoid invalid operations and waste terminal resources.

For example, if the remaining capacity of the terminal is lower than a preset capacity, it can also be determined that the time domain resource does not need to disconnect the terminal from the first operator network on the time domain resource to perform activities in the second operator network, so as to avoid excessive power consumption of the terminal.

Figure 3:
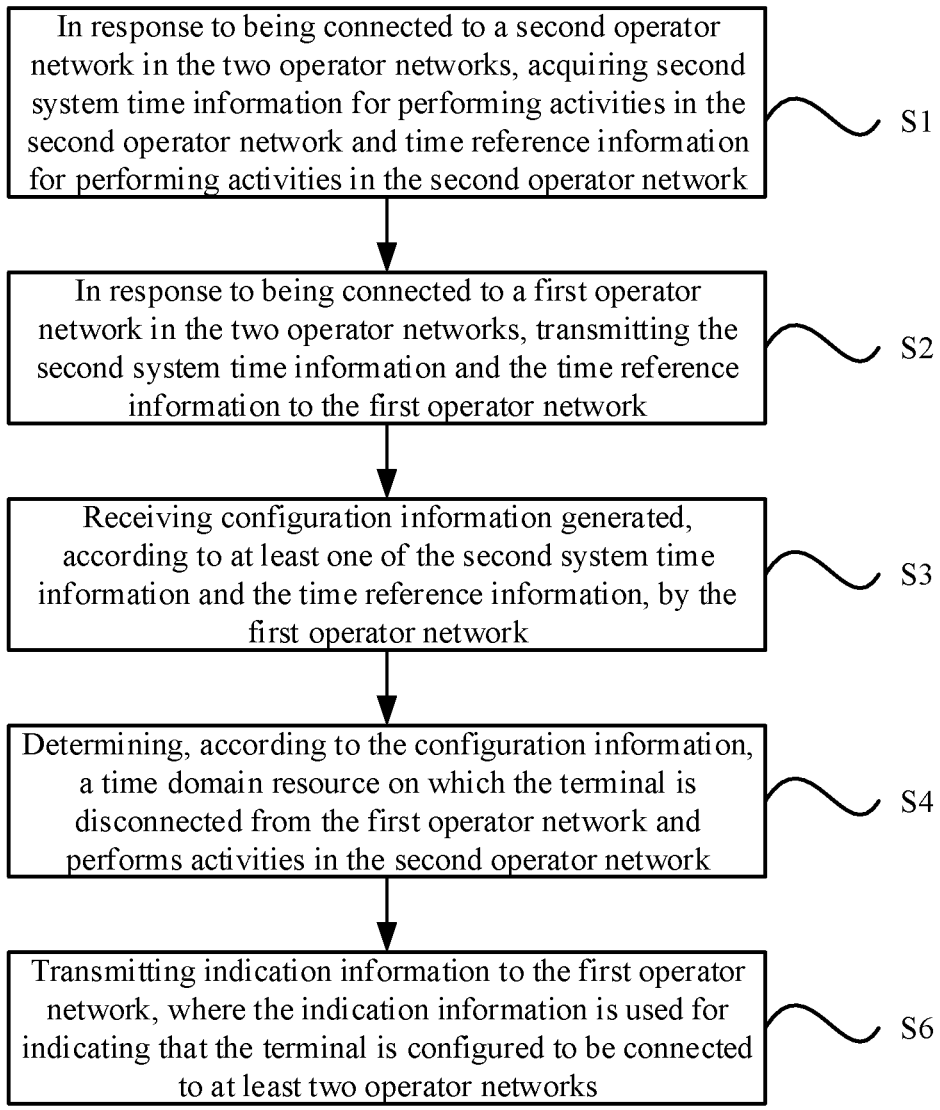
FIG. 3 is a schematic flowchart illustrating another method for determining a network switching resource according to some embodiments of the present disclosure.

FIG. 3 is a schematic flowchart illustrating another method for determining a network switching resource according to some embodiments of the present disclosure. As shown in FIG. 3, the method further includes step S6.

In step S6, indication information is transmitted to the first operator network, and the indication information is used for indicating that the terminal is configured to be connected to at least two operator networks.

In an embodiment, the terminal may transmit the indication information to the first operator network to indicate the first operator network that the terminal is used to connect to at least two operator networks, that is, to inform the first operator that the terminal itself is a multi-card multi-standby terminal, so that the first operator network may generate and transmit the configuration information to the terminal only when it is determined that the terminal is a multi-card multi-standby terminal.

In some embodiments, the system time information includes a system frame number.

In an embodiment, the second system time information is used to represent the relative time for the terminal performing the activity in the second operator network, and in addition to the system frame number, other information may be selected as the second system time information according to requirements.

In some embodiments, the time reference information includes at least one of:

a system message transmission period, a tracking area updating period, a paging period.

In an embodiment, the time reference information may be configured according to the type of the activity. For example, if the type of the activity is receiving a system message, then the time reference information may be a system message transmission period. If the type of the activity is monitoring paging, then the time reference information may be a paging period. If the type of the activity is tracking area updating, then the time reference information may be a tracking area updating period.

In some embodiments, type of activities performed in the second operator network includes at least one of:

monitoring a paging message transmitted from the second operator network, responding to the paging message transmitted from the second operator network, measuring communication information of the second operator network, receiving system a message transmitted from the second operator network, and updating a tracking area in the second operator network.

Figure 4:
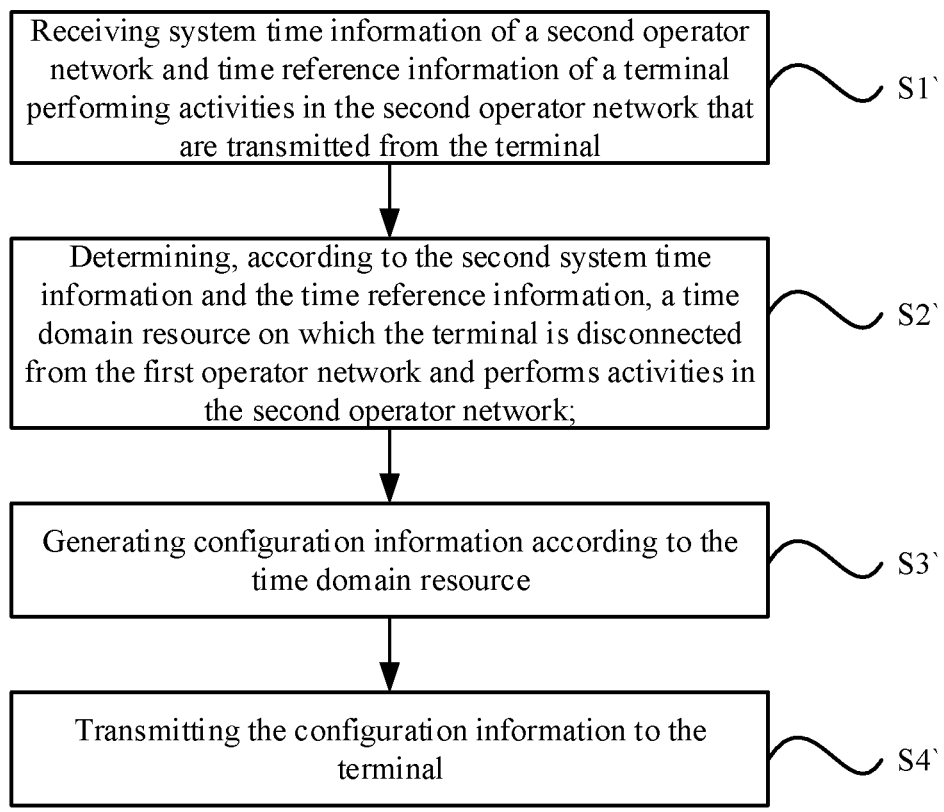
FIG. 4 is a schematic flowchart illustrating a method for configuring a network switching resource according to some embodiments of the present disclosure.

FIG. 4 is a schematic flowchart illustrating a method for configuring a network switching resource according to some embodiments of the present disclosure. The method for configuring a network switching resource shown in the embodiments of the present disclosure may be applicable to the first operator network, for example, the first operator network in the above embodiment. The first operator network can establish communication connection with the terminal, for example, it can establish connection with SIM card 1 of a plurality of SIM cards in the terminal.

As shown in FIG. 4, the method for configuring a network switching resource can include steps described below.

In step S1', the following information transmitted from the terminal is received: system time information of the second operator network; and time reference information of the terminal performing activities in the second operator network.

In an embodiment, when being connected to the second operator network, the terminal may acquire the second system time information of the second operator network and the time reference information of performing activities in the second operator network. For example, SIM card 2 in the terminal may acquire and store the second system time information and the time reference information.

In step S2', a time domain resource is determined according to the second system time information and/or the time reference information, on the time domain resource, the terminal is disconnected from the first operator network and performs activities in the second operator network.

In an embodiment, when being connected to the first operator network, the terminal may transmit the second system time information of the second operator network and the time reference information of performing activities in the second operator network to the first operator network. For example, SIM card 2 in the terminal may transmit the stored second system time information and the time reference information to SIM card 1, and then the second system time information and the time reference information are transmitted to the first operator network by SIM card 1.

In an embodiment, after receiving the second system time information and the time reference information, the first operator network can determine the time domain resource according to the second system time information and/or the time reference information, and then generate the configuration information according to the time domain resource.

The second system time information is used to represent the relative time for the terminal to perform activities in the second operator network. For example, the second system time information is a system frame number, the activity is receiving the system message transmitted from the second operator network, and the time reference information is the system message transmission period.

For example, the terminal receives the system message in the second operator network at the 6th system frame number, and the system message transmission period is 5 milliseconds.

In the case where the first operator network generates the configuration information according to the second system time information and the time reference information, for example, the determined time domain resource is the 6th frame+n×5 milliseconds in the second operator network, and then the configuration information is generated according to the determined time domain resource. The user equipment receives the system message transmitted from the second operator network according to the time domain resource configured by the configuration information.

Accordingly, on the one hand, the time domain resource is determined according to the relative time of the second operator network, on the other hand, the configured time domain resources are made to meet the requirements of the terminal's activities in the second operator network, ensuring that the terminal can quickly receive the system message transmitted from the second operator network after being disconnected from the first operator network according to the configuration information, without waiting for a long time for the action of the second operator network, and can complete the activities in the second operator network as soon as possible. After performing activities in the second operator network, when it is necessary to reconnect to the first operator network, the connection to the first operator network can be restored as soon as possible, which is beneficial to ensure the good effect of communication between the first operator network and the terminal.

In the case where the first operator network generates the configuration information according to the second system time information, conditions of activities of the terminal in the first operator network may be considered. For example, the communication quality between the terminal and the first operator network, the type of business that the terminal communicates with the first operator network, etc. Take the type of business that the terminal communicates with the first operator network as an example, if the type of business of the communication between the terminal and the first operator network has lower latency requirements at the time t1 after the 6th frame in the second operator network, then the time domain resource can be determined to be the 6th frame+t1 in the second operator network, and then the configuration information is generated according to the determined time domain resource.

Accordingly, on the one hand, the time domain resource is determined according to the relative time of the second operator network, on the other hand, the configured time domain resources are made to meet the requirements of the terminal's activities in the first operator network. Since the type of business of the communication between the terminal and the first operator network has lower latency requirements on the time domain resource corresponding to the 6th frame+t1 in the second operator network, the user equipment is configured according to the configuration information to receive the system message transmitted from the second operator network on this time domain resource, and an impact on the business due to being disconnected from the first operator network is low.

In the case where the first operator network generates configuration information according to the time reference information, the relative time of the first operator network, that is, the first system time information of the first operator network, can be considered. For example, when the terminal received the system message in the second operator network last time, the system frame number of the first operator network was the 13th frame, thus the determined time domain resource is the 13th frame+n×5 milliseconds in the first operator network, and then the configuration information is generated according to the determined time domain resource, and the user equipment receives the system message transmitted from the second operator network according to the time domain resource configured by the configuration information.

Accordingly, on the one hand, the time domain resource is determined according to the relative time of the first operator network, on the other hand, the configured time domain resources are made to meet the requirements of the terminal's activities in the second operator network, ensuring that the terminal can quickly receive the system message transmitted from the second operator network after being disconnected from the first operator network according to the configuration information, without waiting for a long time for the action of the second operator network, and can complete the activities in the second operator network as soon as possible. After performing activities in the second operator network, when it is necessary to reconnect to the second operator network, the connection to the first operator network can be restored as soon as possible, which is beneficial to ensure the good effect of communication between the first operator network and the terminal.

It should be noted that, in addition to the second system time information and/or the time reference information, other factors can also be used by the first operator network to determine the time domain resource and generate the configuration information, which may be specifically provided as needed.

In step S3', configuration information is generated according to the time domain resource.

In step S4', the configuration information is transmitted to the terminal.

According to embodiments of the present disclosure, the terminal transmits the second system time information and the time reference information to the first operator network, so that the first operator network can relatively accurately configure the time domain resource for the terminal. During this process, the first operator network does not need to interact with the second operator network, and the consumption caused by interaction between the operator networks can be reduced.

Moreover, since the time domain resource is configured for the terminal by the first operator network, the configured time domain resource is known by the first operator network, thus when the terminal is disconnected from the first operator network and performs activities in the second operator network on the time domain resource, the first operator network will not mistakenly believe that there is a problem with the communication connection with the terminal, and will not increase the power, or even trigger the wrong operation of the wireless link recovery mechanism, thus effectively avoiding the waste of the network resource of the first operator.

Figure 5:
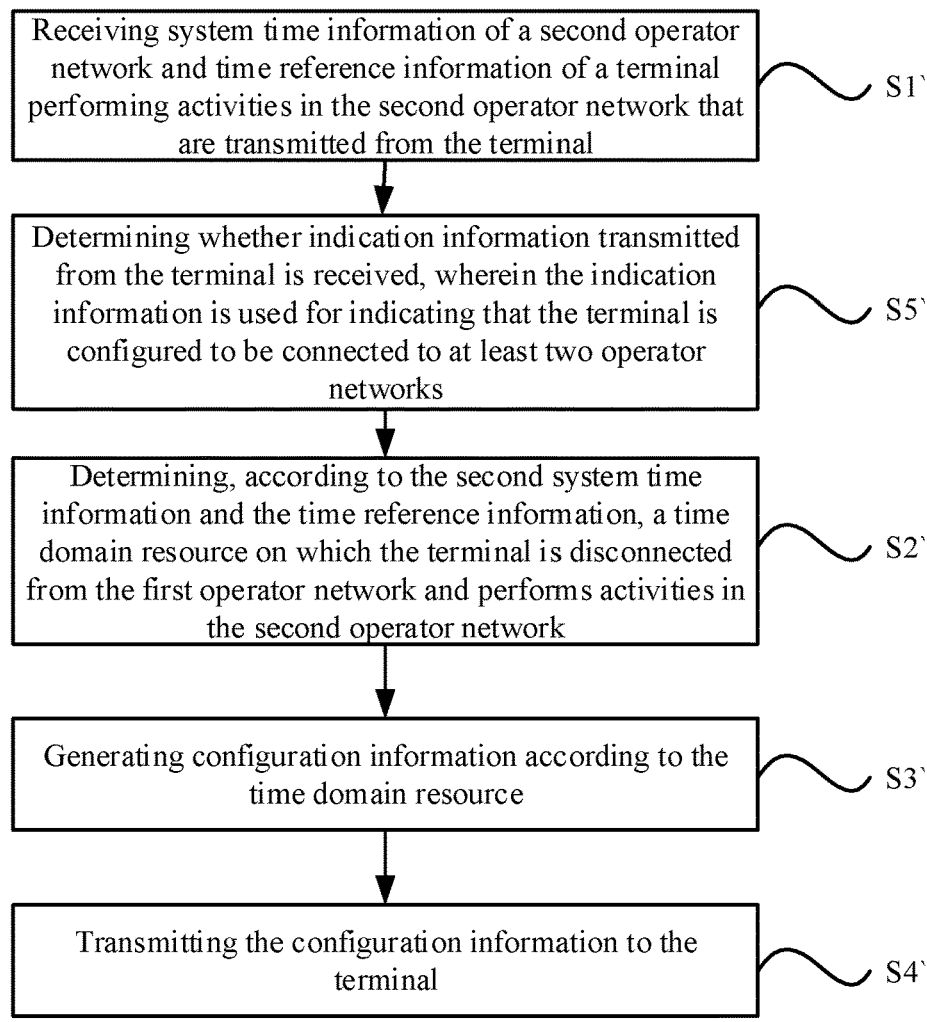
FIG. 5 is a schematic flowchart illustrating another method for configuring a network switching resource according to some embodiments of the present disclosure.

FIG. 5 is a schematic flowchart illustrating another method for configuring a network switching resource according to embodiments of the present disclosure. As shown in FIG. 5, the method further includes step S5'.

In step S5', it is determined whether indication information transmitted from the terminal is received, and the indication information is used for indicating the terminal is configured to be connected to at least two operator networks.

In response to the indication information being received, step S2' is performed, that is, determining, according to the first system time information of the first operator network, the second system time information and the time reference information, the time domain resource on which the terminal is disconnected from the first operator network and performs activities in the second operator network.

In an embodiment, the terminal may transmit indication information to the first operator network to indicate that the first operator network that the terminal is configured to be connected to at least two operator networks, that is, to inform the first operator that the terminal itself is a multi-card multi-standby terminal, so that the first operator network may generate and transmit the configuration information to the terminal only when it is determined that the terminal is a multi-card multi-standby terminal.

In some embodiments, the system time information includes a system frame number.

In some embodiments, the time reference information includes at least one of:

a system message transmission period, a tracking area updating period and a paging period.

In some embodiments, a type of activities performed in the second operator network includes at least one of:

monitoring a paging message transmitted from the second operator network, responding to the paging message transmitted from the second operator network, measuring communication information of the second operator network, receiving a system message transmitted from the second operator network, and updating a tracking area in the second operator network.

Corresponding to the embodiments of the method for determining a network switching resource and the method for configuring a network switching resource, the present disclosure further provides embodiments of a device for determining a network switching resource and a device for configuring a network switching resource.

Figure 6:
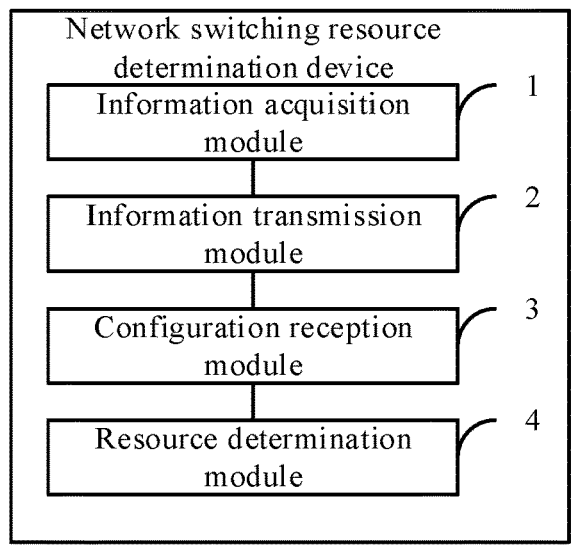
FIG. 6 is a schematic block diagram illustrating a device for determining a network switching resource according to some embodiments of the present disclosure.

FIG. 6 is a schematic block diagram illustrating a device for determining a network switching resource according to some embodiments of the present disclosure. The paging response device shown in the embodiments of the present disclosure may be applicable to a terminal, and the terminal may perform communications based on a multi-card single-standby (for example, dual-card single-standby) mode, or a multi-card and multi-standby (for example, dual-card dual-standby) mode, or Multi-card multi-standby multi-pass (for example, dual-card dual-standby dual-pass) mode.

The terminal is configured to be connected to at least two operator networks, for example, the terminal may be used as user equipment to communicate with a base station in an operator network, and the terminal may be provided with a plurality of SIM cards, specifically USIM. SIM card 1 in the plurality of SIM cards may be connected to a first operator network, and SIM card 2 in the plurality of SIM cards may be connected to a second operator network. The first operator network and the second operator network are networks provided by different operators, for example, the first operator network may be a mobile network, and the second operator network may be a network of China Unicom or China Telecom.

As shown in FIG. 6, the device for determining a network switching resource includes:

an information acquisition module 1, configured to: in response to a terminal being connected to a second operator network in the two operator networks, acquire second system time information for performing activities in the second operator network and time reference information for performing activities in the second operator network;

an information transmission module 2, configured to: in response to the terminal being connected to a first operator network in the two operator networks, transmit the second system time information and the time reference information to the first operator network;

a configuration reception module 3, configured to receive configuration information generated, according to the second system time information and/or the time reference information, by the first operator network;

a resource determination module 4, configured to determine, according to the configuration information, a time domain resource on which the terminal is disconnected from the first operator network and performs activities in the second operator network.

Figure 7:
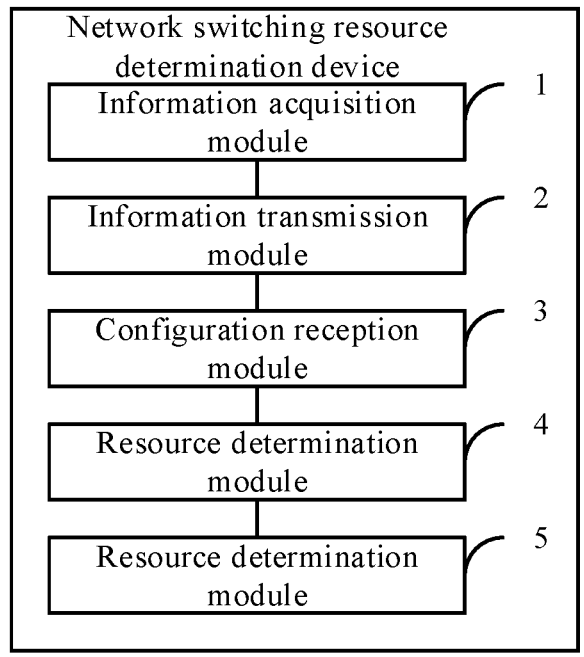
FIG. 7 is a schematic block diagram illustrating another device for determining the network switching resource according to an embodiment of the present disclosure.

FIG. 7 is a schematic block diagram illustrating another device for determining the network switching resource according to some embodiments of the present disclosure. As shown in FIG. 7, the device further includes:

a network switching module 5, configured to cause the terminal to be disconnected from the first operator network and perform activities in the second operator network on the time domain resource.

Figure 8:
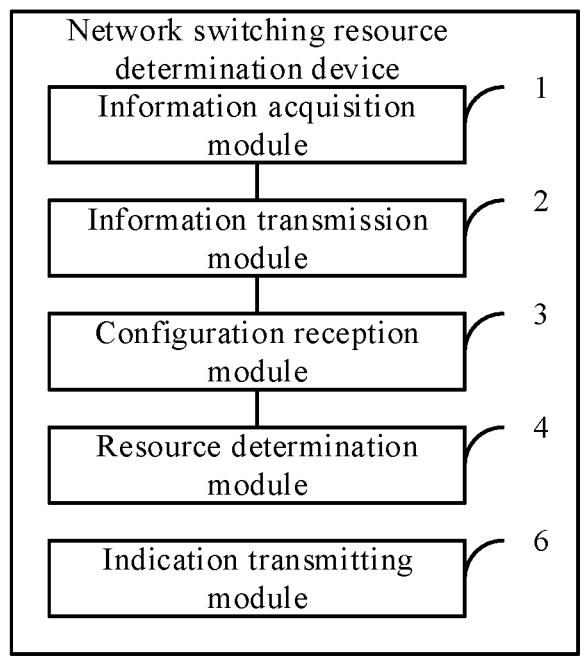
FIG. 8 is a schematic block diagram illustrating another apparatus for determining the network switching resource according to some embodiments of the present disclosure.

FIG. 8 is a schematic block diagram illustrating another device for determining the network switching resource according to some embodiments of the present disclosure. As shown in FIG. 8, the device further includes:

an indication transmission module 6, configured to transmit indication information to the first operator network, and the indication information is used for indicating that the terminal is configured to be connected to at least two operator networks.

In some embodiments, the system time information includes a system frame number.

In some embodiments, the time reference information includes at least one of:

a system message transmission period, a tracking area updating period, a paging period.

In some embodiments, a type of activities performed in the second operator network includes at least one of:

monitoring a paging message transmitted from the second operator network, responding to the paging message transmitted from the second operator network, measuring communication information of the second operator network, receiving a system message transmitted from the second operator network, and updating a tracking area in the second operator network.

Figure 9:
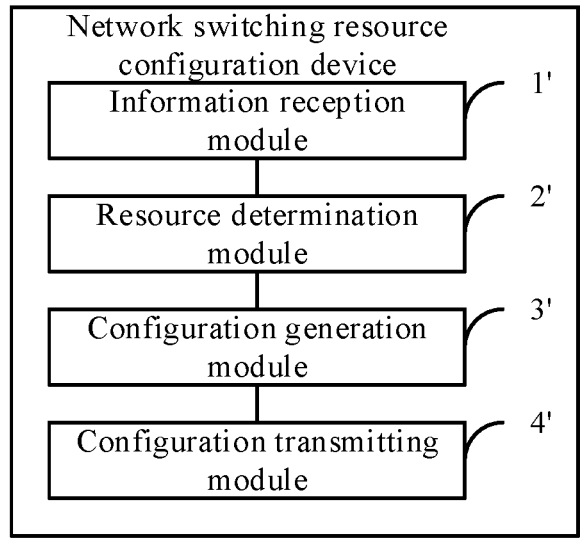
FIG. 9 is a schematic block diagram illustrating a device for configuring a network switching resource according to some embodiments of the present disclosure.

FIG. 9 is a schematic block diagram illustrating a device for configuring a network switching resource according to some embodiments of the present disclosure. The device for configuring a network switching resource shown in the embodiments of the present disclosure may be applicable to the second operator network, for example, the second operator network in the above embodiment, the second operator network can establish communication connection with the terminal, for example, it can establish connection with SIM card 2 among multiple SIM cards in the terminal.

As shown in FIG. 9, the device for configuring a network switching resource can include:

an information reception module 1', configured to receive system time information of the second operator network transmitted from the terminal and time reference information of the terminal performing activities in the second operator network;

a resource determination module 2', configured to determine, according to the second system time information and/or the time reference information, a time domain resource on which the terminal is disconnected from the first operator network and performs activities in the second operator network;

a configuration generation module 3', configured to generate configuration information according to the time domain resource;

a configuration transmission module 4', configured to transmit the configuration information to the terminal.

Figure 10:
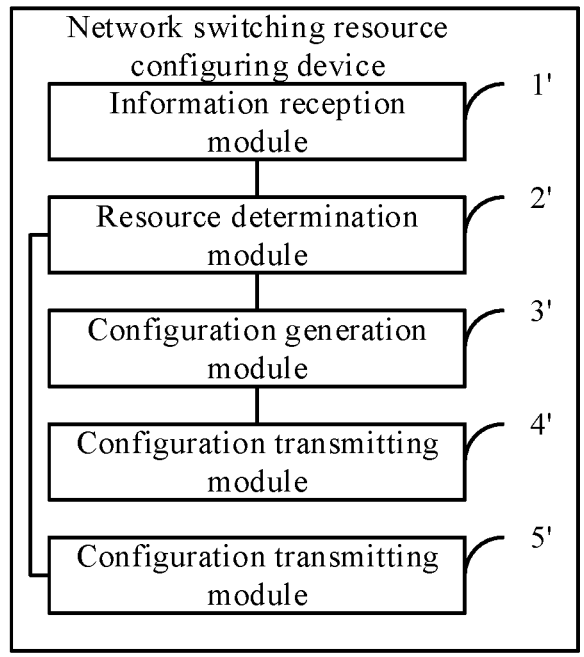
FIG. 10 is a schematic block diagram illustrating another device for configuring a network switching resource according to some embodiments of the present disclosure.

FIG. 10 is a schematic block diagram illustrating another device for configuring a network switching resource according to some embodiments of the present disclosure. As shown in FIG. 10, the device further includes:

an indication determination module 5', configured to determine whether indication information transmitted from the terminal is received, and the indication information is used for indicating that the terminal is configured to be connected to at least two operator networks.

The resource determination module 2' is configured to: in response to determining that the indication information is received, determine, according to first system time information of the first operator network, the second system time information and the time reference information, the time domain resource on which the terminal is disconnected from the first operator network and perform activities in the second operator network.

In some embodiments, the system time information includes a system frame number.

In some embodiments, the time reference information includes at least one of:

a system message transmission period, a tracking area updating period and a paging period.

In some embodiments, a type of activities performed in the second operator network includes at least one of:

monitoring a paging message transmitted from the second operator network, responding to the paging message transmitted from the second operator network, measuring communication information of the second operator network, receiving a system message transmitted from the second operator network, and updating a tracking area in the second operator network.

As for the device provided in the above embodiments, the specific manner in which the respective modules perform the operations has been described in detail in the embodiment relating to the method, and will not be explained in detail herein.

Since the device embodiments basically correspond to the method embodiments, reference may be made to the partial description of the method embodiments. The device embodiments described above are merely illustrative, and the modules described as separate components may or may not be physically separate, and the components displayed as modules may or may not be physical units, i.e. may be located a place, or it can be distributed to multiple network modules. Some or all of the modules may be selected according to actual needs to achieve the purpose of the solution of the embodiment. Those of ordinary skill in the art can understand and implement without any creative effort.

An embodiment of the present disclosure further provides an electronic device, including:

a processor;

a memory for storing an instruction executable by the processor;

and the processor is configured to implement the method for determining a network switching resource according to any of the embodiments described above.

An embodiment of the present disclosure further provides an electronic device, including:

a processor;

a memory for storing an instruction executable by the processor;

and the processor is configured to implement the method for configuring a network switching resource according to any of the embodiments described above.

An embodiment of the present disclosure further provides a computer-readable storage medium having a computer program stored thereon, the program is executed by a processor to implement the steps in the method for determining a network switching resource described above according to any of the embodiments.

An embodiment of the present disclosure also provides a computer-readable storage medium having a computer program stored thereon, the program is executed by a processor to implement the steps in the method for configuring a network switching resource according to any of the embodiments described above.

Figure 11:
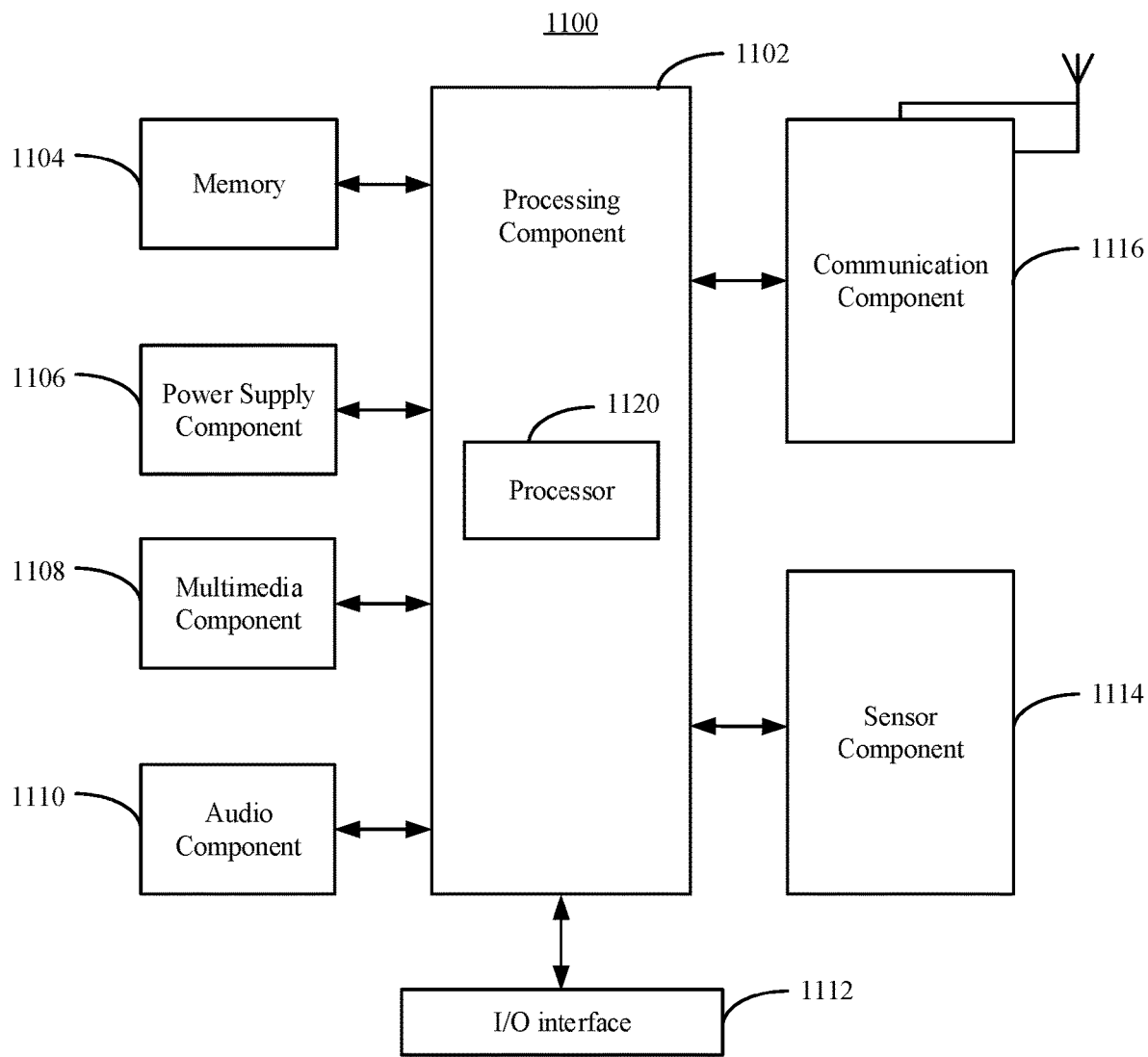
FIG. 11 is a schematic block diagram illustrating a device for determining a network switching resource according to some embodiments of the present disclosure.

FIG. 11 is a schematic block diagram illustrating a device 1100 for determining a network switching resource according to an embodiment of the present disclosure. For example, the device 1100 can be a mobile phone, a computer, a digital broadcast terminal, a messaging device, a gaming console, a tablet device, a medical device, a fitness device, a personal digital assistant or the like.

Referring to FIG. 11, the device 1100 can include one or more of the following components: a processing component 1102, a memory 1104, a power supply component 1106, a multimedia component 1108, an audio component 1110, an I/O interface 1112, a sensor component 1114, and a communication component 1116.

The processing component 1102 typically is configured to control the overall operation of the device 1100, such as operations associated with displaying, telephone calling, data communications, camera operations, and recording operations. The processing component 1102 can include one or more processors 1120 to execute instructions, to perform all or part of the steps of the method for determining a network switching resource described above. Moreover, the processing component 1102 can include one or more modules to facilitate interaction between the processing component 1102 and other components. For example, the processing component 1102 can include a multimedia module to facilitate interaction between the multimedia component 1108 and the processing component 1102.

The memory 1104 is configured to store various data to support operations of the device 1100. Examples of the data include instructions of any application or method that can be run on the device 1100, contact data, phonebook data, messages, pictures and videos and the like. The memory 1104 can be implemented by any type of volatile or non-volatile storage device or their combination, such as static random access memory (SRAM), electrically erasable programmable read-only memory (EEPROM), erasable and Programmable read-only memory (EPROM), programmable read-only memory (PROM), read-only memory (ROM), magnetic memory, flash memory, magnetic disk or optical disk.

The power supply component 1106 is configured to supply power to various components of the device 1100. The power supply component 1106 may include a power management system, one or more power supplies, and other components associated with generating, managing, and distributing power for the device 1100.

The multimedia component 1108 includes a screen that provides an output interface between the device 1100 and the user. In some embodiments, the screen may include a liquid crystal display (LCD) and a touch panel (TP). If the screen includes a touch panel, the screen may be implemented as a touch screen to receive input signals from the user. The touch panel includes one or more touch sensors to sense touch, swiping, and gestures on the touch panel. The touch sensor may not only sense the boundary of the touch or swipe action, but also detect the duration and pressure related to the touch or swipe operation. In some embodiments, the multimedia component 1108 includes a front camera and/or a rear camera. When the device 1100 is in an operation mode, such as a shooting mode or a video mode, the front camera and/or the rear camera can receive external multimedia data. Each front camera and rear camera can be a fixed optical lens system or have focal length and optical zoom capabilities.

The audio component 1110 is configured to output and/or input audio signals. For example, the audio component 1110 includes a microphone (MIC), and when the mobile device 1100 is in an operation mode, such as a call mode, a recording mode, and a voice recognition mode, the microphone is configured to receive external audio signals. The received audio signal may be further stored in the memory 1104 or transmitted via the communication component 1116. In some embodiments, the audio component 1110 further includes a speaker for outputting audio signals.

The I/O interface 1112 provides an interface between the processing component 1102 and a peripheral interface module. The peripheral interface module may be a keyboard, a click wheel, a button, and the like. The button includes but not limits to a home button, a volume button, a start button and a lock button.

The sensor component 1114 includes one or more sensors for providing the device 1100 with state evaluation in various aspects. For example, the sensor component 1114 can detect the on/off state of the device 1100 and relative positioning of components, such as the display and keypad of the mobile device 1100. The sensor component 1114 can also detect the position change of the mobile device 1100 or a component of the mobile device 1100, the presence or absence of contact between the user and the mobile device 1100, the orientation or acceleration/deceleration of the mobile device 1100, and the temperature change of the mobile device 1100. The sensor component 1114 may include a proximity sensor configured to detect the presence of nearby objects without physical contact. The sensor component 1114 may also include a light sensor used for imaging application, such as a complementary metal oxide semiconductor (CMOS) or a charge coupled device (CCD) image sensor. In some embodiments, the sensor component 1114 may also include an acceleration sensor, a gyroscope sensor, a magnetic sensor, a pressure sensor or a temperature sensor.

The communication component 1116 is configured to facilitate wired or wireless communication between the device 1100 and other devices. The device 1100 can access a wireless network based on a communication standard, such as Wi-Fi, 2G, or 3G, or a combination thereof. In an exemplary embodiment, the communication component 816 receives a broadcast signal or broadcast related information from an external broadcast management system via a broadcast channel. In an exemplary embodiment, the communication component 1116 further includes a near field communication (NFC) module to facilitate short-range communication. For example, the NFC module can be implemented based on radio frequency identification (RFID) technology, infrared data association (IrDA) technology, ultra-wideband (UWB) technology, Bluetooth (BT) technology and other technologies.

In an exemplary embodiment, the device 1100 may be implemented by one or more application specific integrated circuits (ASIC), digital signal processors (DSP), digital signal processing devices (DSPD), programmable logic devices (PLD), field programmable gate array (FPGA), a controller, a microcontroller, a microprocessor, or other electronic components, to execute the foregoing method.

In an exemplary embodiment, there is further provided a non-transitory computer-readable storage medium including instructions, such as a memory 1104 including instructions, which may be executed by the processor 1120 of the device 1100 to complete the foregoing method for determining a network switching resource. For example, the non-transitory computer-readable storage medium may be a ROM, a random access memory (RAM), a CD-ROM, a magnetic tape, a floppy disk, an optical data storage device, etc.

Figure 12:
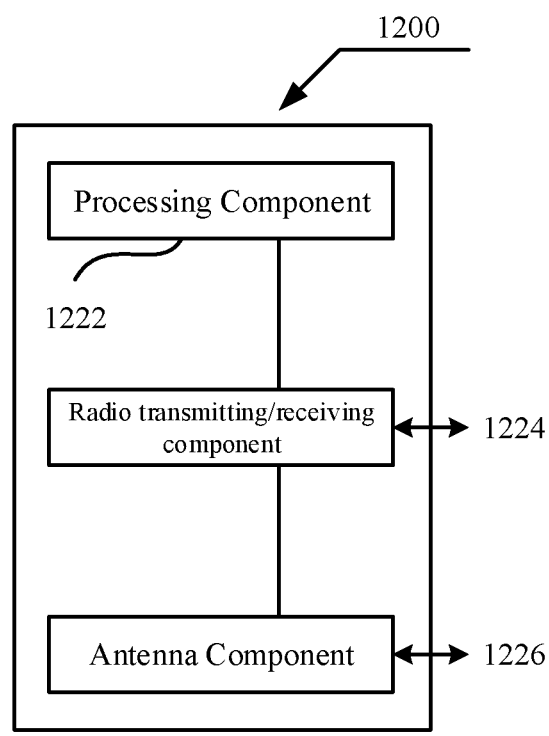
FIG. 12 is a schematic block diagram illustrating a device for configuring a network switching resource according to some embodiments of the present disclosure.

As shown in FIG. 12, FIG. 12 is a schematic block diagram illustrating a device 1200 for configuring a network switching resource according to an embodiment of the present disclosure. Referring to FIG. 12, the device 1200 includes a processing component 1222, a radio transmitting/receiving component 1224, an antenna component 1226, and a signal processing portion specific to the wireless interface. The processing component 1222 can further include one or more processors. One of the processors in the processing component 1222 may be configured to implement the method described in any of the above embodiments for configuring a network switching resource.

Other embodiments of the present disclosure will be apparent to those skilled in the art from consideration of the specification and practice of the present disclosure disclosed here. The present disclosure is intended to cover any variations, uses, or adaptations of the present disclosure following the general principles of the present disclosure and including the common general knowledge in the art or the conventional technical means not disclosed in the present disclosure. It is intended that the specification and embodiments be considered as exemplary only.

It will be appreciated that the present disclosure is not limited to the exact construction that has been described above and illustrated in the accompanying drawings, and that various modifications and changes can be made without departing from the scope thereof.

The present disclosure may include dedicated hardware implementations such as disclosure specific integrated circuits, programmable logic arrays and other hardware devices. The hardware implementations can be constructed to implement one or more of the methods described herein. Examples that may include the apparatus and systems of various implementations can broadly include a variety of electronic and computing systems. One or more examples described herein may implement functions using two or more specific interconnected hardware modules or devices with related control and data signals that can be communicated between and through the modules, or as portions of an application-specific integrated circuit. Accordingly, the system disclosed may encompass software, firmware, and hardware implementations. The terms "module," "sub-module," "circuit," "sub-circuit," "circuitry," "sub-circuitry," "unit," or "sub-unit" may include memory (shared, dedicated, or group) that stores code or instructions that can be executed by one or more processors. The module refers herein may include one or more circuit with or without stored code or instructions. The module or circuit may include one or more components that are connected.

It should be noted that, in this context, relational terms such as "first" and "second" are used merely to distinguish one entity or operation from another entity or operation, and do not necessarily require or imply any such actual relationship or order between such entities or operations. The terms "including", "comprising" or any other variation thereof are intended to cover a non-exclusive inclusion, such that a process, method, article or apparatus that includes a series of elements does not include only those elements but may include other elements not expressly listed, or elements that are inherent to such a process, method, article or apparatus. Without further restrictions, an element that is defined by the phrase "comprising a . . . " does not exclude the presence of additional equivalent elements in the process, method, article or apparatus that includes the element.

The method and device provided by the embodiments of the present disclosure are described in detail above, the principles and implementations of the present disclosure are described in the specific examples, the description of the above embodiments is only used to help understand the method of the present disclosure and core ideas thereof; at the same time, for those skilled in the art, there will be changes in the specific embodiments and the scope of application according to the idea of the present disclosure, and in summary, the contents of the present specification should not be construed as limiting the present disclosure.

What is claimed is:

1. A method for determining a network switching resource, applied to a terminal configured to be connected to at least two operator networks, the method comprising:
   in response to the terminal being connected to a second operator network in the two operator networks, acquiring second system time information for performing activities in the second operator network and time reference information for performing the activities in the second operator network, wherein the time reference information comprises at least a system message transmission period;
   in response to the terminal being connected to a first operator network in the two operator networks, transmitting the second system time information and the time reference information to the first operator network;
   receiving configuration information that is generated, by the first operator network without interacting with the second operator network, according to conditions of activities in the first operator network by the terminal and according to at least one of: the second system time information or the time reference information, wherein the conditions of the activities in the first operator network comprise at least one of: a communication quality of the terminal with the first operator network, or a type of business that the terminal communicates with in the first operator network; and
   determining, according to the configuration information, a time domain resource;
   wherein the method further comprises:
   determining, according to an actual situation at the time domain resource, whether to disconnect from the first operator network on the time domain resource and perform the activities in the second operator network, wherein the actual situation comprises at least one of: a priority of a communication between the first terminal and the first operator network, whether a SIM card connected to the second operator network is still in the terminal, or remaining capacity of the terminal; and
   wherein a type of the activities performed in the second operator network comprises measuring communication information of the second operator network.

2. The method according to claim 1, further comprising:
   disconnecting, on the time domain resource, from the first operator network and performing the activities in the second operator network.

3. The method according to claim 1, further comprising:
   transmitting indication information to the first operator network, wherein the indication information is used for indicating that the terminal is configured to be connected to at least two operator networks.

4. The method according to claim 1, wherein the system time information comprises a system frame number.

5. The method according to claim 1, wherein the time reference information further comprises a tracking area updating period and a paging period.

6. The method according to claim 1, wherein the type of the activities performed in the second operator network further comprises at least one of:
   monitoring a paging message transmitted from the second operator network, responding to the paging message transmitted from the second operator network, or updating a tracking area in the second operator network.

7. A non-transitory computer-readable storage medium having a computer program stored thereon, wherein the program, when executed by a processor, is used to implement the steps in the method for determining a network switching resource according to claim 1.

8. A method for configuring a network switching resource, applied to a first operator network, the method comprising:
receiving second system time information of a second operator network and time reference information of a terminal performing activities in the second operator network that are transmitted from the terminal, wherein the time reference information comprises at least a system message transmission period;
determining, according to conditions of activities in the first operator network by the terminal and according to at least one of: the second system time information or the time reference information, a time domain resource without interacting with the second operator network, wherein an actual situation at the time domain resource is configured for the terminal to determine whether to disconnect from the first operator network on the time domain resource and perform the activities in the second operator network, wherein the actual situation comprises at least one of: a priority of a communication between the first terminal and the first operator network, whether a SIM card connected to the second operator network is still in the terminal, or remaining capacity of the terminal; wherein the conditions of the activities in the first operator network comprise at least one of: a communication quality of the terminal with the first operator network, or a type of business that the terminal communicates with in the first operator network; and wherein a type of the activities performed in the second operator network comprises measuring communication information of the second operator network;
generating configuration information according to the time domain resource; and
transmitting the configuration information to the terminal.

9. The method according to claim 8, further comprising:
determining whether indication information transmitted from the terminal is received, wherein the indication information is used for indicating that the terminal is configured to be connected to at least two operator networks; and
in response to the indication information being received, determining, according to first system time information of the first operator network, the second system time information and the time reference information, the time domain resource on which the terminal is disconnected from the first operator network and performs the activities in the second operator network.

10. The method according to claim 8, wherein the second system time information comprises a system frame number.

11. The method according to claim 8, wherein the time reference information further comprises at least one of:
a tracking area updating period, or a paging period.

12. The method according to claim 8, wherein the type of the activities performed in the second operator network further comprises at least one of:
monitoring a paging message transmitted from the second operator network, responding to the paging message transmitted from the second operator network, or updating a tracking area in the second operator network.

13. An electronic device, comprising:
a processor; and
a memory for storing instructions executable by the processor;
wherein the processor is configured to implement the method for configuring the network switching resource according to claim 8.

14. A non-transitory computer-readable storage medium having a computer program stored thereon, wherein the program, when executed by a processor, is used to implement the steps in the method for configuring a network switching resource according to claim 8.

15. A device for determining a network switching resource, applied to a terminal configured to be connected to at least two operator networks, the device comprising:
a processor; and
a memory for storing instructions executable by the processor;
wherein the processor is configured to: in response to being connected to a second operator network in the two operator networks, acquire second system time information for performing activities in the second operator network and time reference information for performing the activities in the second operator network, wherein the time reference information comprises at least a system message transmission period;
in response to being connected to a first operator network in the two operator networks, transmit the second system time information and the time reference information to the first operator network;
receive configuration information that is generated, by the first operator network without interacting with the second operator network, according to conditions of activities in the first operator network by the terminal and according to at least one of: the second system time information or the time reference information, wherein the conditions of the activities in the first operator network comprise at least one of: a communication quality of the terminal with the first operator network, or a type of business that the terminal communicates with in the first operator network; and
determine, according to the configuration information, a time domain resource;
wherein the processor is further configured to:
determine, according to an actual situation at the time domain resource, whether to disconnect from the first operator network on the time domain resource and perform the activities in the second operator network, wherein the actual situation comprises at least one of: a priority of a communication between the first terminal and the first operator network, whether a SIM card connected to the second operator network is still in the terminal, or remaining capacity of the terminal; and wherein a type of the activities performed in the second operator network comprises measuring communication information of the second operator network.

16. The device according to claim 15, the processor is further configured to:
cause the terminal to be disconnected from the first operator network and perform the activities in the second operator network, on the time domain resource.

17. The device according to claim 15, wherein the processor is further configured to:
transmit indication information to the first operator network, wherein the indication information is used for indicating that the terminal is configured to be connected to at least two operator networks.

18. The device according to claim 16, wherein the system time information comprises a system frame number.

19. The device according to claim 16, wherein the time reference information further comprises at least one of:
a tracking area updating period, or a paging period.

20. The device according to claim 16, wherein the type of the activities performed in the second operator network further comprises at least one of:
monitoring a paging message transmitted from the second operator network, responding to the paging message transmitted from the second operator network, or updating a tracking area in the second operator network.

* * * * *